United States Patent [19]

Kaplinsky

[11] Patent Number: 4,847,612
[45] Date of Patent: Jul. 11, 1989

[54] PROGRAMMABLE LOGIC DEVICE

[75] Inventor: Cecil H. Kaplinsky, Palo Alto, Calif.

[73] Assignee: Plug Logic, Inc., Santa Clara, Calif.

[21] Appl. No.: 143,619

[22] Filed: Jan. 13, 1988

[51] Int. Cl.⁴ .............................................. H04Q 1/00
[52] U.S. Cl. .............................. 340/825.800; 307/465; 340/825.830
[58] Field of Search ........................ 307/465, 468, 469; 340/825.8, 825.83, 825.84

[56] References Cited

U.S. PATENT DOCUMENTS

| | | | |
|---|---|---|---|
| 4,124,899 | 11/1978 | Birkner et al. | 307/465 |
| 4,207,556 | 6/1980 | Sugiyama et al. | 340/166 R |
| 4,314,349 | 2/1982 | Batcher | 364/716 |
| 4,414,547 | 11/1983 | Knapp et al. | 340/825.83 |
| 4,422,072 | 12/1983 | Cavlan | 340/825.87 |
| 4,431,928 | 2/1984 | Skokan | 307/465 |
| 4,609,986 | 9/1986 | Hartmann et al. | 364/200 |
| 4,642,487 | 2/1987 | Carter | 307/465 |
| 4,670,749 | 6/1987 | Freeman | 307/465 X |
| 4,763,020 | 8/1988 | Takata et al. | 307/465 |

OTHER PUBLICATIONS

Ikawa et al., "A One-Day Chip: An Innovative IC Construction Approach...", *IEEE Journal of Solid-State Circuits*, vol. SC-21, No. 2, Apr. 1986, pp. 223–227.

"Technology to Watch: Programmable Logic Devices", *Electronics*, Sep. 17, 1987, pp. 65–72.

P. Robinson, "Overview of Programmable Hardware", *BYTE*, Jan. 1987, pp. 197–203.

V. Coli, "Introduction to Programmable Array Logic", *BYTE*, Jan. 1987, pp. 207–219.

*Primary Examiner*—Ulysses Weldon
*Attorney, Agent, or Firm*—Thomas Schneck

[57] ABSTRACT

A programmable logic device architecture having a matrix of smaller functional units, each of which being a programmable logic array, and a set of fixed conductive lines connected to the functional unit inputs and outputs, the conductive lines forming programmable interconnection matrices. The input pins can be programmably connected to any input of any functional unit, and the outputs of functional units can be programmably connected to any input of any functional unit or any output pin. The interconnection matrices may be a simple array of crossing conductive lines with crossings connected by fuses, EPROM, or EEPROM switches or may have additional series switches to limit the effective impedance so as to speed propagation through these matrices. A fast path through one functional unit bypassing the interconnection matrices is available for a limited number of input and output pins. Multiplexers and other structures may be provided at ends of the fixed conductive lines to enable exhaustive testing of individual functional units, interconnections and logic, and structure may also be provided for on-chip monitoring of state information and providing the information to the external world when certain preselected events happen.

33 Claims, 12 Drawing Sheets

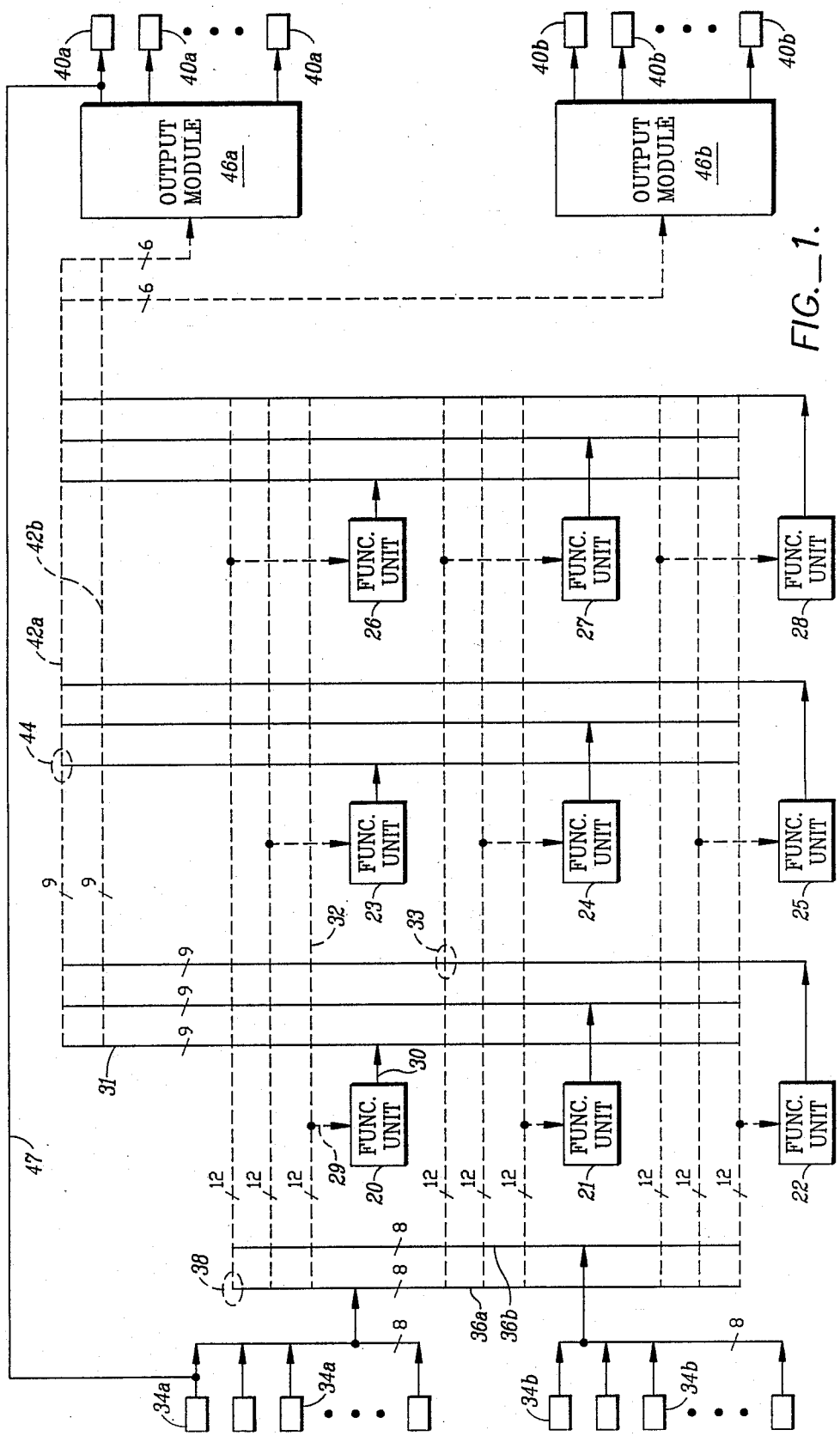
FIG._1.

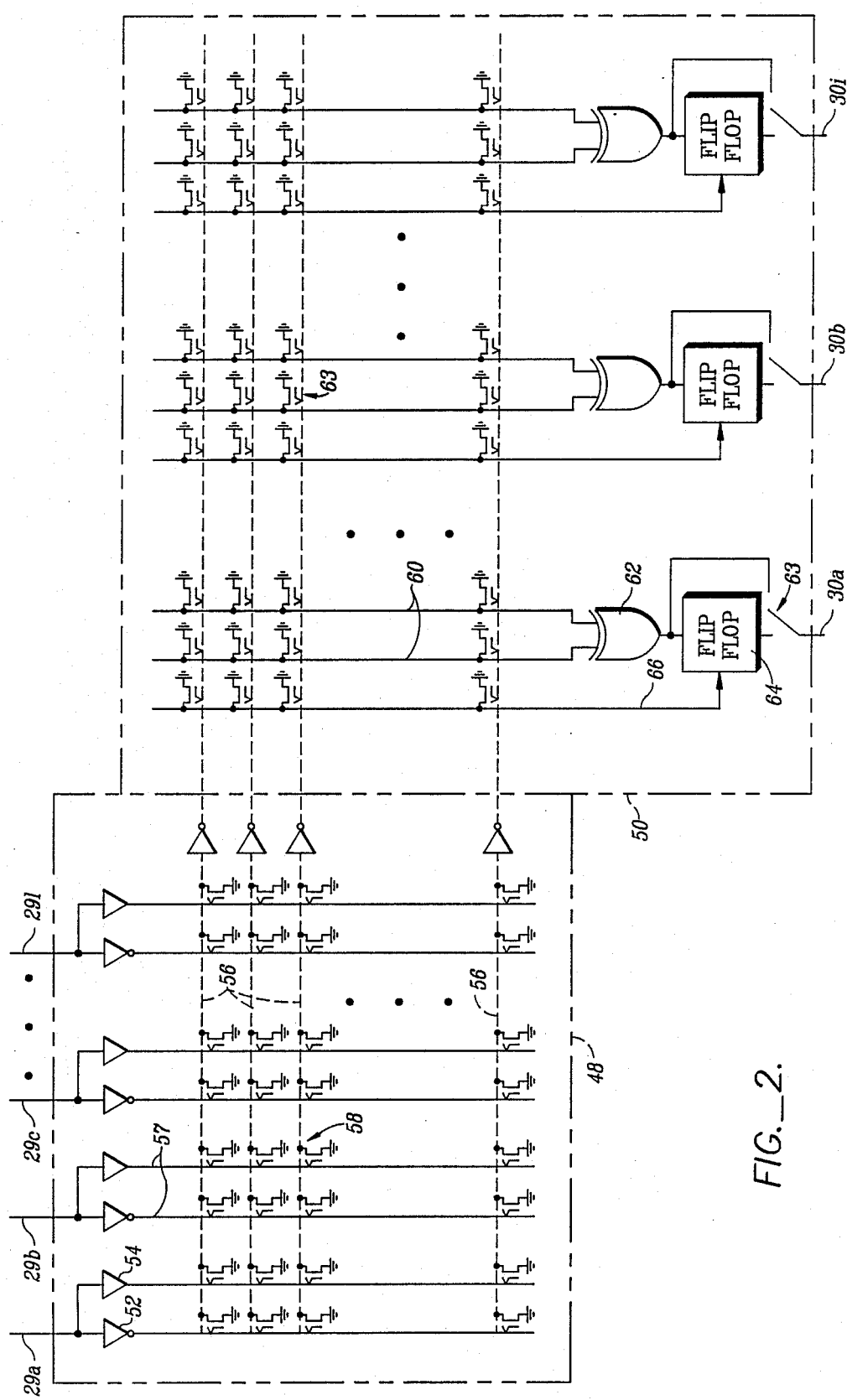
FIG._2.

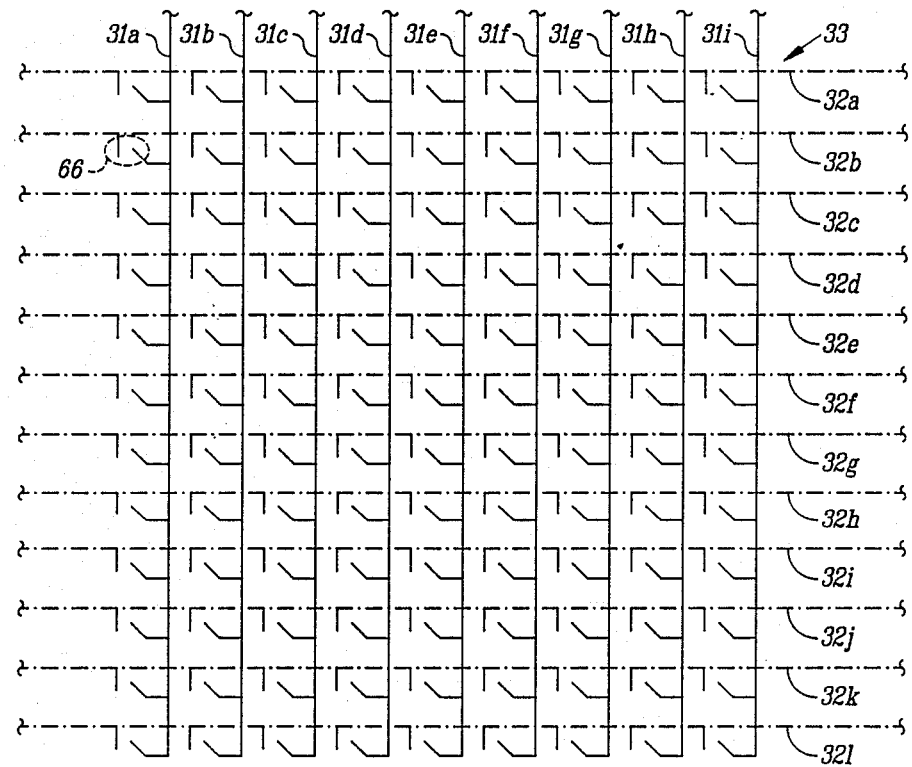
FIG._3.
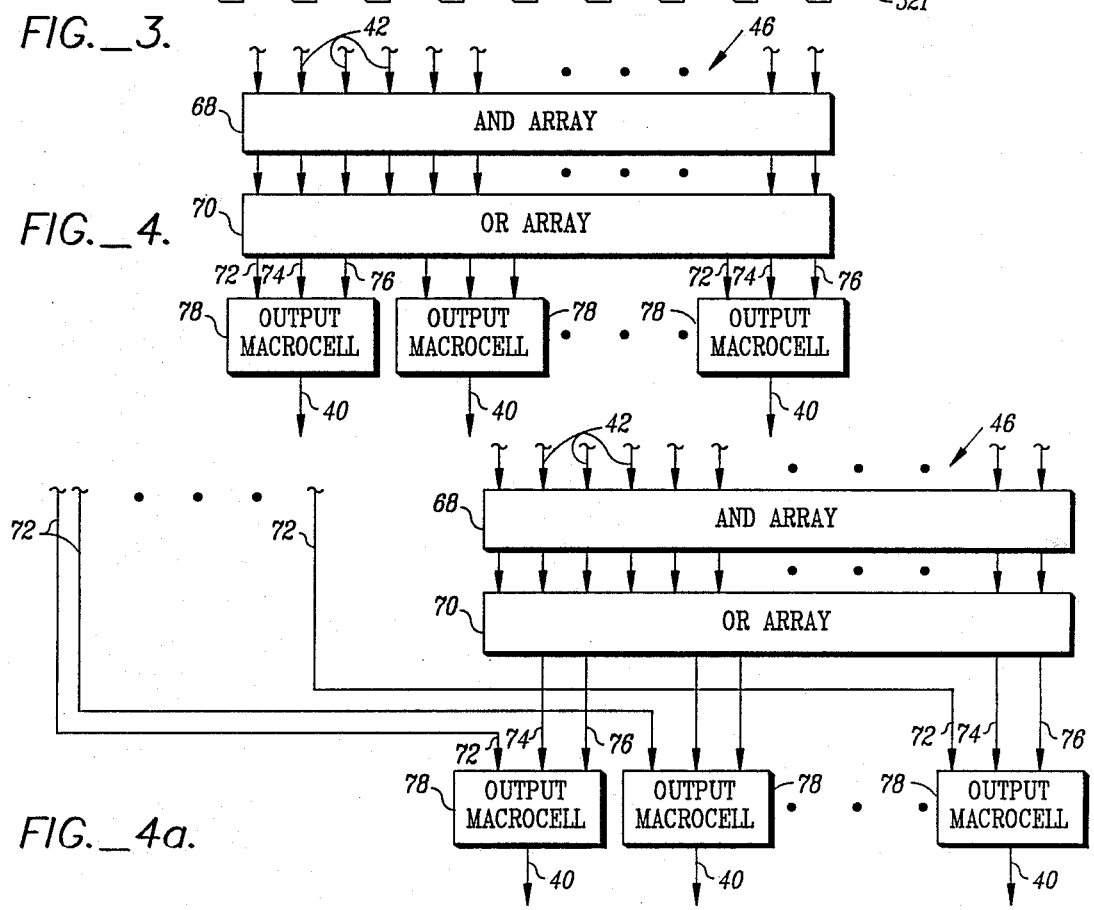
FIG._4.
FIG._4a.

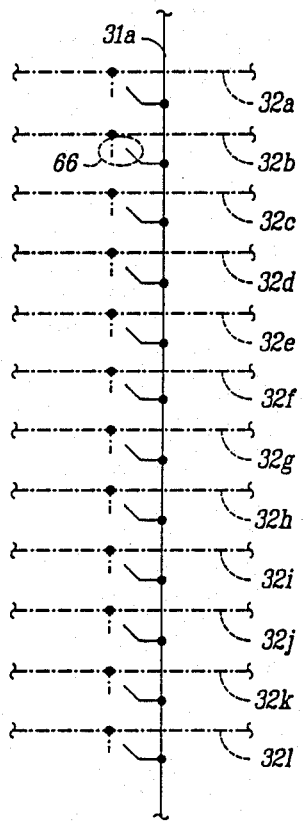
FIG._5a.
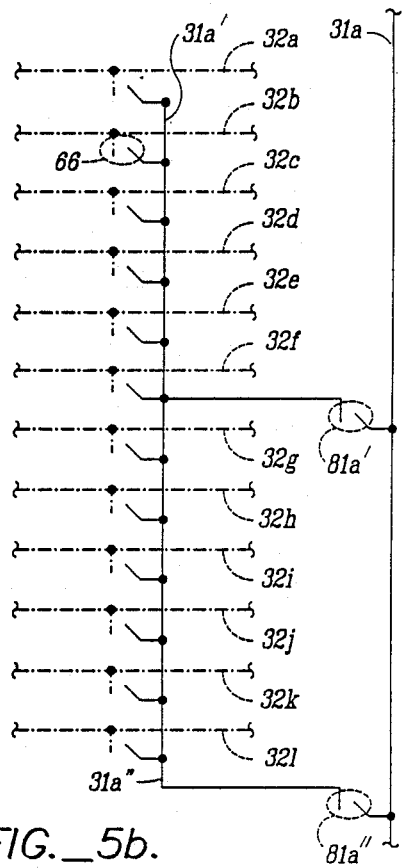
FIG._5b.
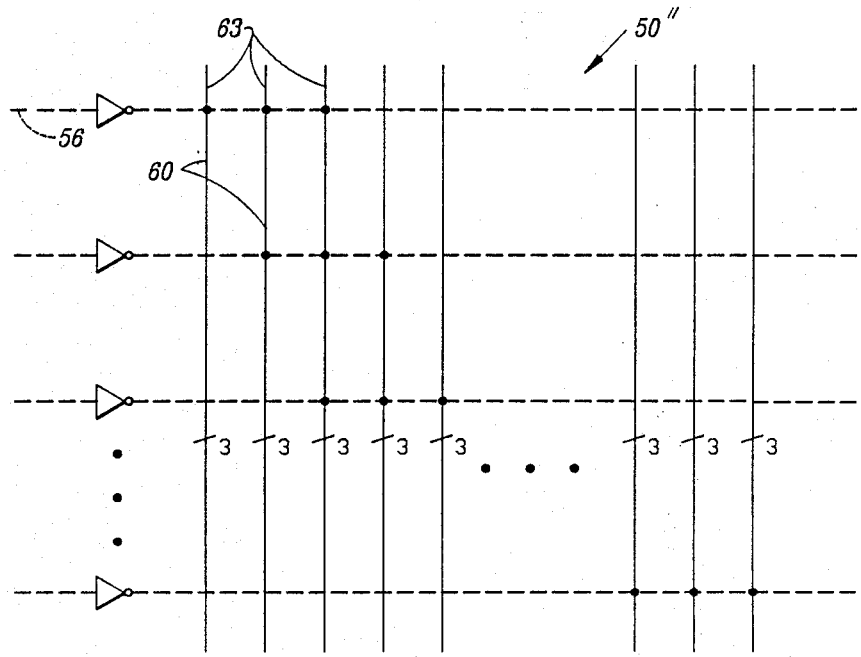
FIG._6a.

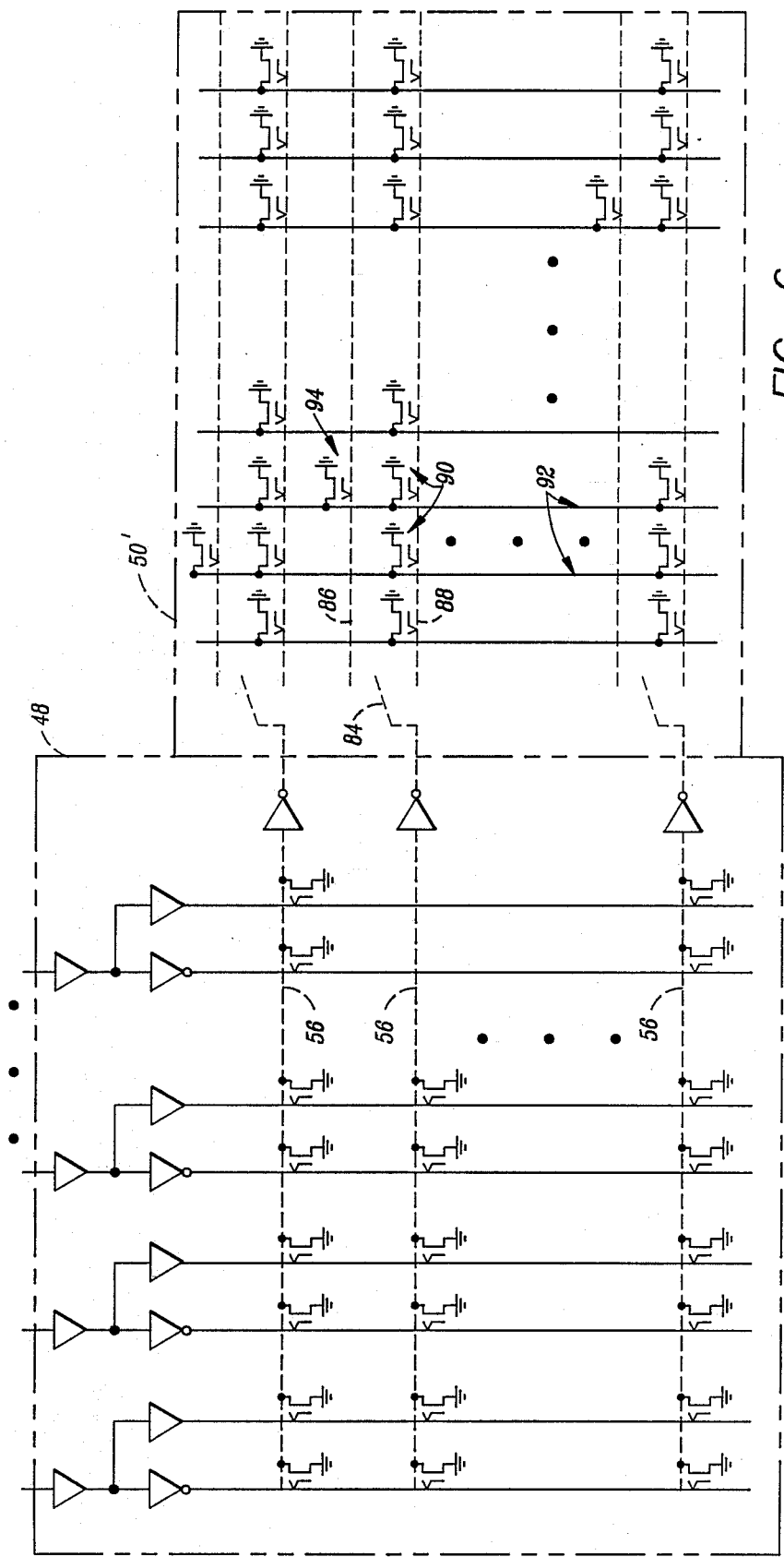
FIG._6.

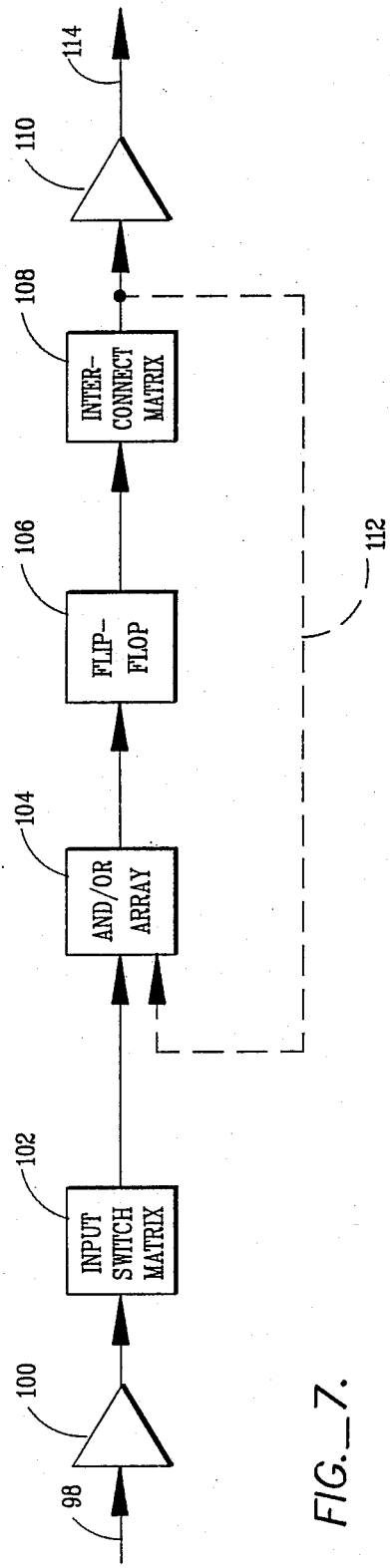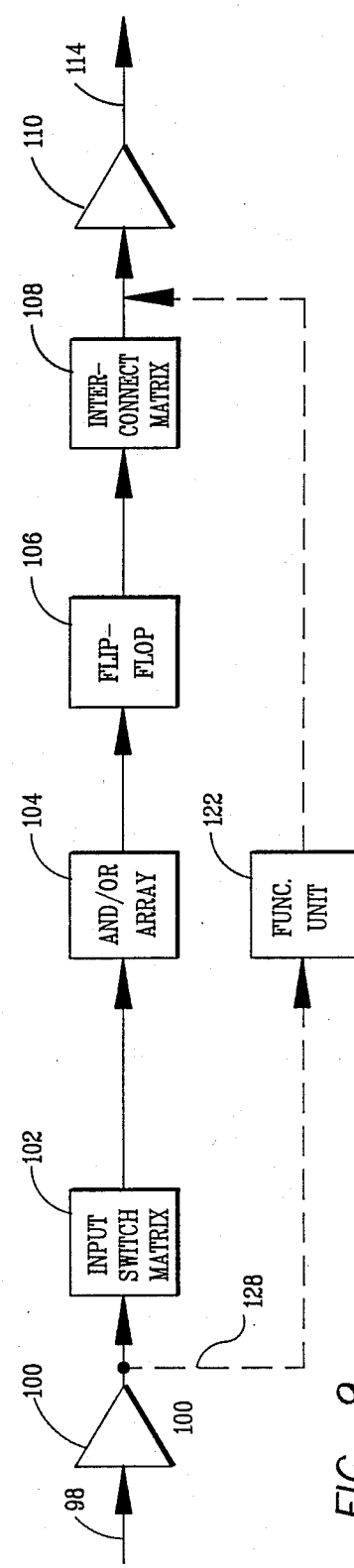
FIG._7.
FIG._9.

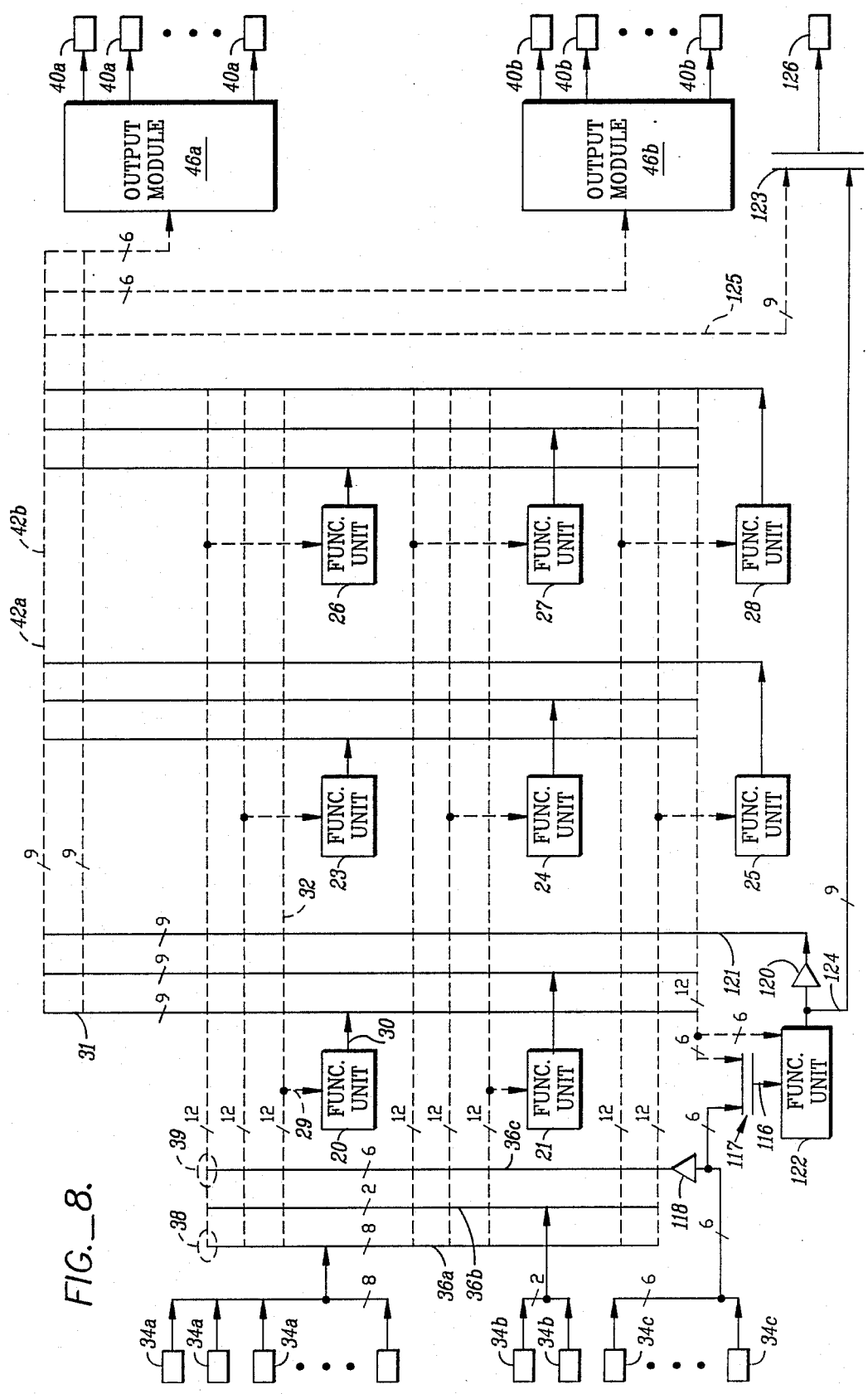
FIG._8.

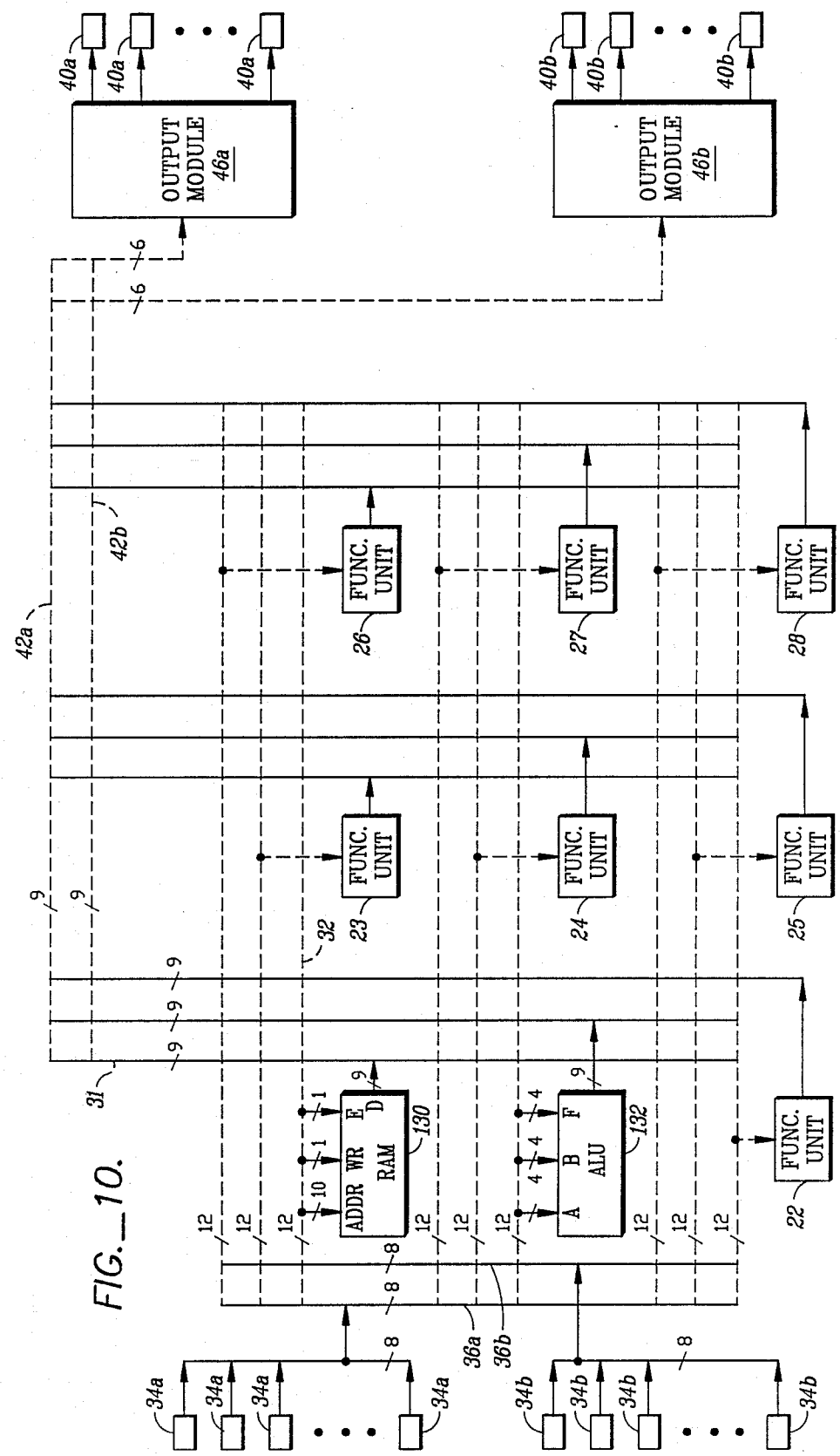
FIG._10.

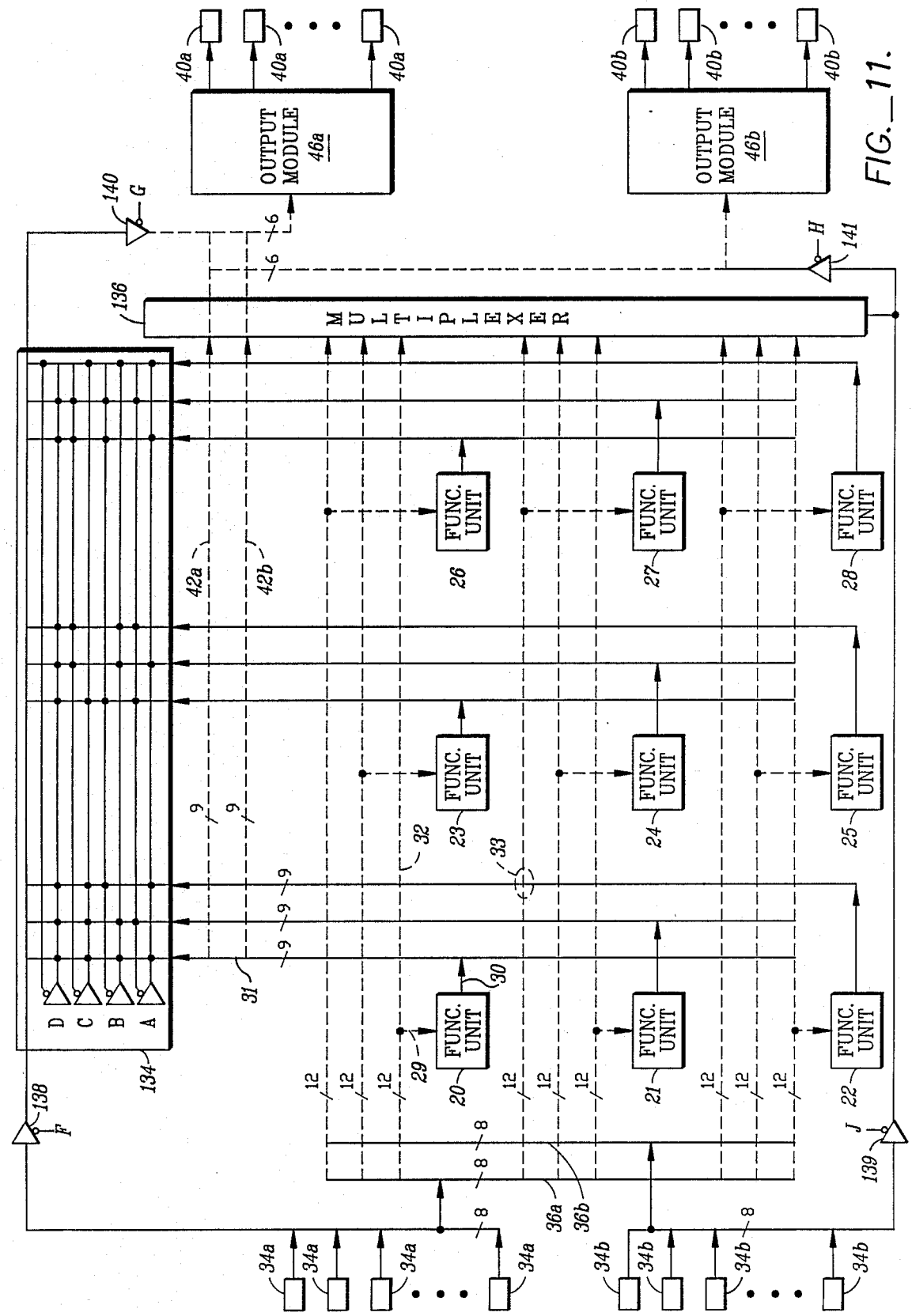
FIG._11.

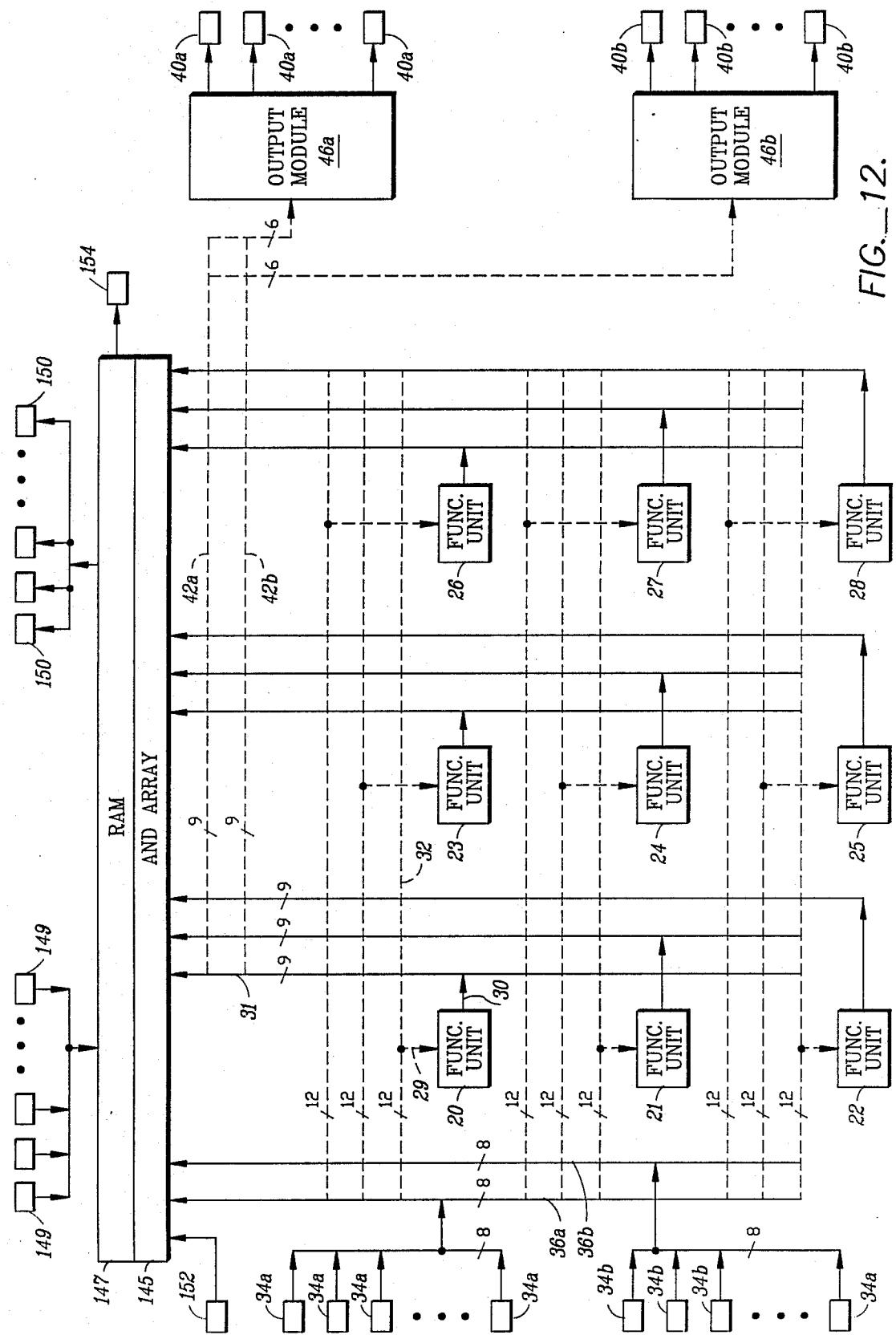
FIG._12.

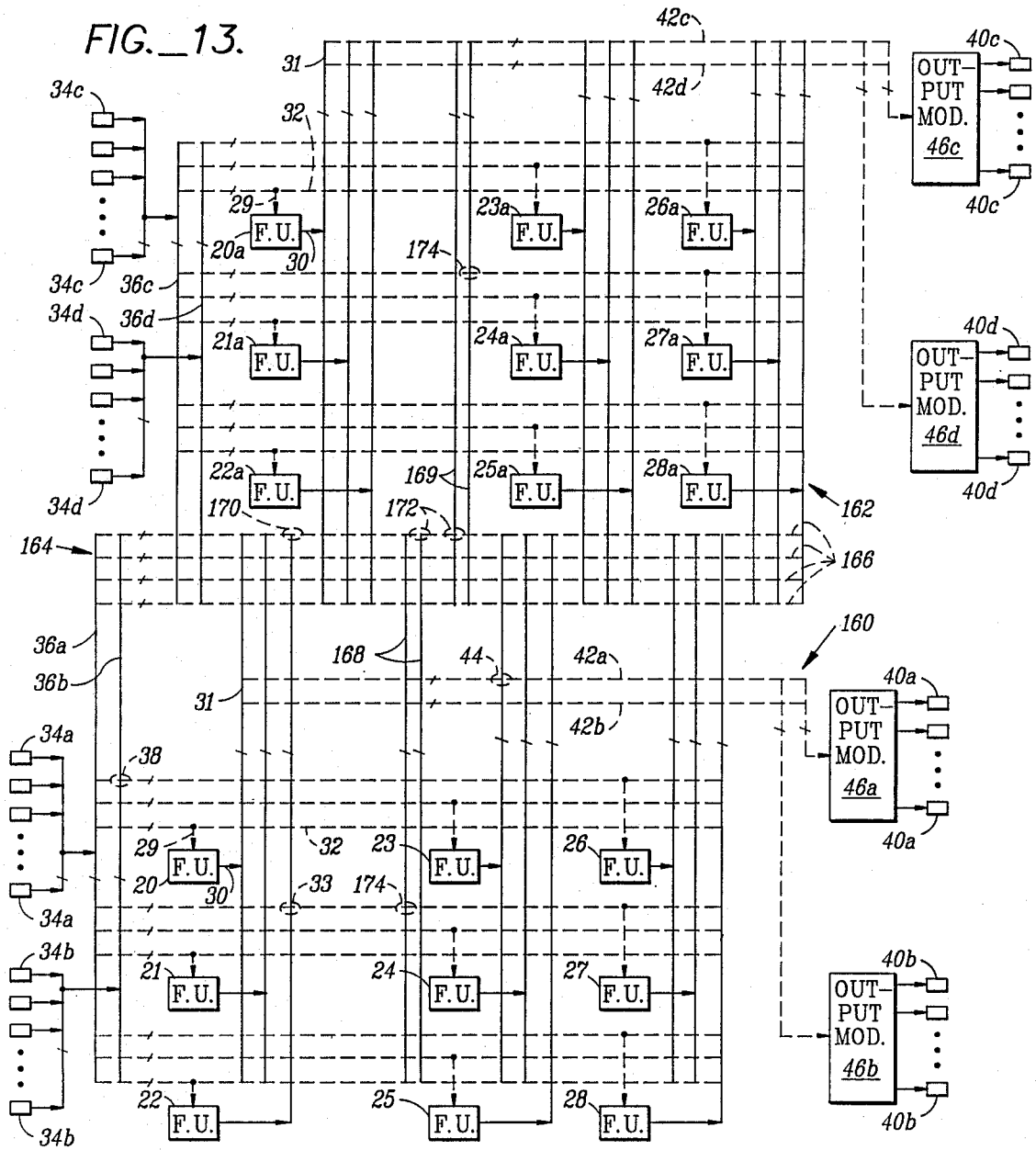
FIG._13.

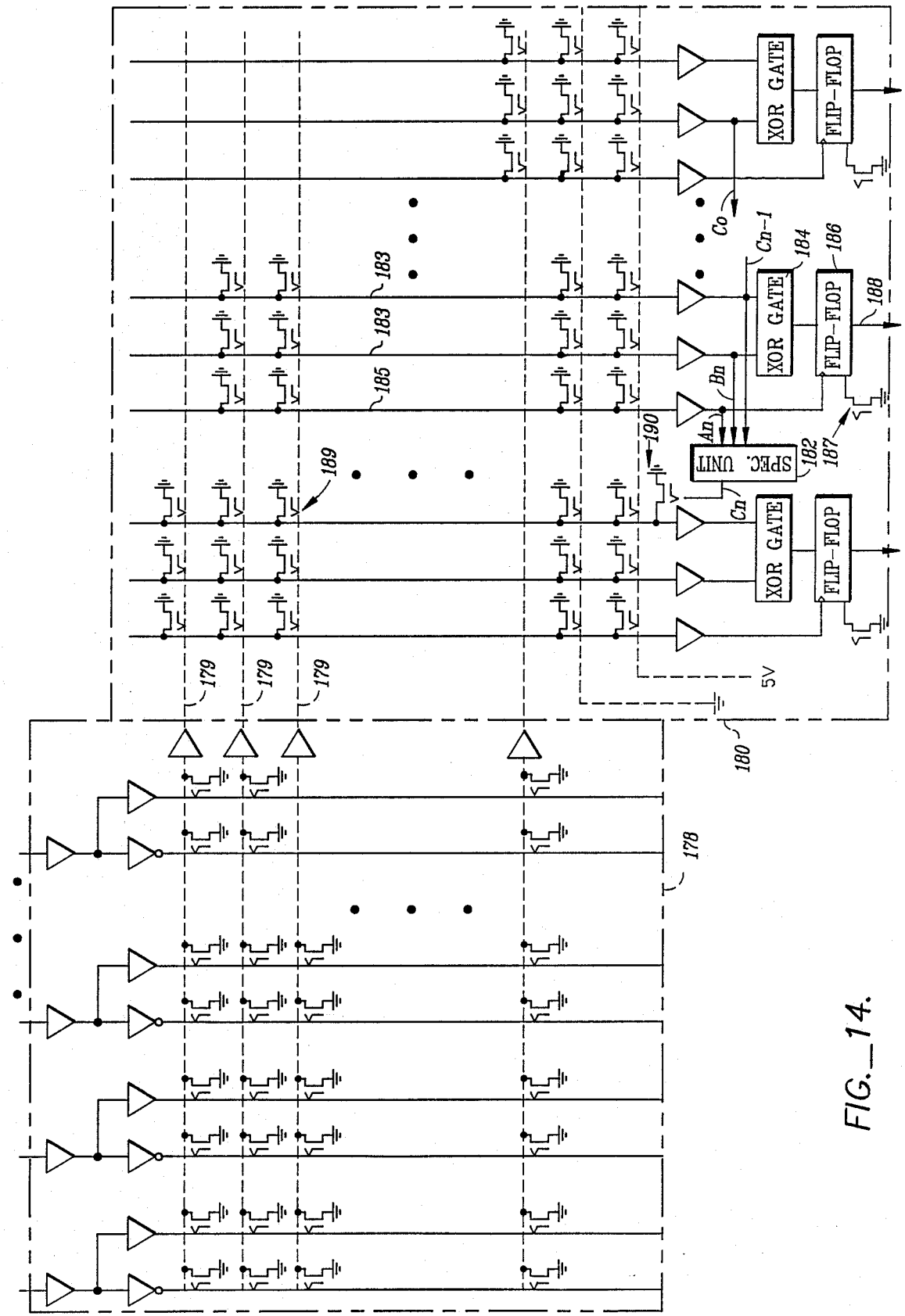
FIG._14.

PROGRAMMABLE LOGIC DEVICE

DESCRIPTION

1. Technical Field

The present invention relates to a class of integrated circuits known as programmable logic devices, whether mask programmable, fusible, ultraviolet erasable reprogrammable or electrically erasable reprogrammable, and in particular to architectures for programmable logic devices for optimizing speed and functional flexibility.

2. Background Art

Programmable logic devices (PLDs) are integrated circuits which increasingly are being used to provide the logic for electronic systems. For example, these devices may be used as "glue" to electrically connect and control the interaction of the major parts of a microcomputer system. Typically, PLDs include a set of input pins, two arrays of logic gates, i.e. an AND array followed by an OR array, and a set of output pins. Frequently, flip-flops following the OR array together with feedback lines are also included in order to provide registered output and sequential logic capabilities instead of the combinatorial logic provided by the AND-/OR arrays alone.

Presently, several basic types of PLD architectures are available. In programmable logic elements (PLEs), the AND array is fixed and the OR array is programmable. PLEs are useful in applications requiring most or all possible input combinations, such as lookup tables and character generators. However, because the array size must be doubled for each additional input, PLEs are limited by cost and performance constraints to a small number of inputs. Programmable logic arrays (PLAs) have both a programmable AND array and a programmable OR array. Programmable array logic (PAL) devices have a programmable AND array, but a fixed OR array. Both the PLA and PAL architectures have advantages. Because both arrays are programmable, PLAs offer a high degree of functional flexibility. However, PALs are faster, because a programmable OR array is slower than dedicated OR gates. The PLA's flexibility is useful for complex state-machine and sequence applications, while most other applications not requiring a high degree of flexibility take advantage of the PAL's speed.

Some attempts have been made to combine both functional flexibility and speed in a PLD architecture. In Monolithic Memories' series of MEGAPALS, the size of the AND array was increased and a fixed number of AND product terms were allowed to be shared amongst two outputs. Altera's EP1200 chip is segmented into "sub-PALs" with only four outputs, the outputs of a particular segment being usable as inputs for only some of the sub-PALs. In each case, all of the inputs are available to all of the AND terms simultaneously, resulting in AND arrays with 64 inputs, most of which remaining unused for any given product term. Because of their fixed product terms, there are 16 product terms per OR gate. In practice, few sets of logic need so many inputs to an OR gate.

In U.S. Pat. No. 4,207,556, Sugiyama et al. discloses a programmable logic array arrangement having a plurality of cell units, each comprising a plurality of electronic elements, such as resistors, diodes and transistors, a wiring matrix of row and column lines, and an array unit having a group of switching elements for selectively interconnecting the various row and column lines, and electronic elements. The arrangement sacrifices density and speed for functionality by including a large number of electronic elements with variable wiring in each unit.

In Ikawa et al., "A One Day Chip: An Innovative IC Construction Approach . . . ", IEEE Journal of Solid-State Circuits, vol. Sc-21, No. 2, April 1986, pp. 223–227, a VLSI chip contains 50–200 standard logic functional blocks of SSI/MSI level integration performing various kinds of functions, such as invertors, NORs, NANDs, flip-flops, shift registers, counters, multipliers, ALUs, etc. Each of these fixed functional units may be connected to other functional units by means of an EEPROM switch matrix. The switch matrix provides flexibility and can easily be reprogrammed, but a large number of standard functional blocks must be anticipated to provide true flexibility, most of which would be unused for any given chip function.

An object of the present invention is to provide a programmable logic device architecture which makes good use of chip area, and combines functional flexibility with speed.

Another object of the present invention is to provide an architecture which can be exhaustively tested.

DISCLOSURE OF THE INVENTION

The above objects have been met with a programmable logic device having a plurality of programmable functional units, each of which is similar to a PLA. Two fixed sets of conductive lines, one set permanently connected to the outputs of functional units, the other set permanently connected to the inputs of functional units, form programmable interconnection matrices where the two sets of conductive lines cross. Further, any of the input pins can be programmed to connect to any input of any functional unit, and any of the output pins can be programmed to connect to any output of any functional unit. A limited number of input pins can be connected to a functional unit, outputs of which are directly connected to a limited number of output pins, bypassing the interconnection matrices for speed.

Each interconnection matrix selectively connects the lines for each output of a functional unit to the lines for each input of the same or other functional unit. Typically, lines are connected by closing a switch, such as a fuse, EPROM or EEPROM. The input and output lines of interconnection matrices may be indirectly connected through an extra series switch for each input or output line. Thus, if there is a no connection only the capacitance of the series switch is seen, increasing the speed through an interconnection matrix.

Each functional unit may be configured like a conventional PLA with a number of inputs and outputs, AND and OR arrays, and possibly feedback lines, dedicated units and registers, edge triggered or enabled by a level. Alternatively, some or all of the functional units can be replaced by PALs, ROM, a discrete-logic ALU and the like. The OR array of a PLA can also be configured so that each AND product time is connectable via a switch to two different lines running through the OR array. One is a conventional product time line that may be selected for full functional flexibility, while the other is a line connected to only one, two or some other subset of OR lines that may be selected for speed. Alternatively, the OR array may be only partially populated with programming links.

The architecture may include a pair of multiplexers connected respectively to the two sets of lines dedicated to functional unit inputs and outputs for separate access to individual functional units. This structure facilitates testing of the chip, since each functional unit can be exhaustively tested, then followed by testing of the interconnection matrix programming. A single large PLA can only be partially tested since the number of possible input combinations is too large for exhaustive testing. The lines from functional unit outputs can also be monitored by a programmable AND array and RAM for logic state analysis.

The programmable logic device may have an additional hierarchical level for even greater functionality, being made up of two or more subunits each having a matrix of functional units, conductive lines, input and output pins and interconnection matrices. The subunits are then connectable by a switching matrix in which control connect lines are programmably connected to conductive lines from functional unit outputs and to lines from the input pines and in which lead lines connected to the central connect lines are programmably connectable to conductive lines leading to functional unit inputs and to lines leading to output pins. Thus, any of the outputs from a functional unit in one subunit can be connected to any of the inputs to a functional unit in the other subunit. Input and output pins are likewise connected to functional units in the other subunit.

BRIEF DESCRIPTION OF THE DRAWINGS

FIG. 1 is a schematic showing the basic structure of a programmable logic device of the present invention.

FIG. 2 is a schematic of a functional unit in the device of FIG. 1.

FIG. 3 is a schematic of an interconnection matrix in the device of FIG. 1.

FIG. 4 is a schematic of an output module in the device of FIG. 1.

FIG. 4a is a schematic of an alternative output module for the device of FIG. 1.

FIG. 5a is a closeup view of a portion of the interconnection matrix of FIG. 3. corresponding to a single output line.

FIG. 5b is a schematic of a portion corresponding to a single output line of an alternative interconnection matrix for use in the device of FIG. 1.

FIG. 6 is a closeup view of AND/OR arrays for a functional unit using a first alternative OR array arrangement.

FIG. 6a is a closeup view of a second alternative OR array arrangement.

FIG. 7 is a flow diagram illustrating the propagation times through the device of FIG. 1.

FIG. 8 is a schematic showing a second embodiment of a programmable logic device of the present invention having a direct path through the array.

FIG. 9 is a flow diagram illustrating the propagation times through the device of FIG. 8.

FIG. 10 is a schematic of a third embodiment of a programmable logic device in accord with the present invention.

FIG. 11 is a schematic of a fourth embodiment of a programmable logic device in accord with the present invention having a pair of multiplexers for functional unit level testing.

FIG. 12 is a schematic of a fifth embodiment of a programmable logic device of the present invention having elements for logic state analysis of the device.

FIG. 13 is a schematic of a sixth embodiment of a programmable logic device of the present invention.

FIG. 14 is a close-up view of an alternative functional unit for use in the device of FIG. 1.

BEST MODE FOR CARRYING OUT THE INVENTION

With reference to FIG. 1, a programmable logic device includes a plurality of functional units 20-28. Preferably, the functional units 20-28 are arranged in a matrix of rows and columns. In the example given in FIG. 1, 9 functional units are shown, but the actual number may vary from device to device. Each functional unit includes a set of inputs 29 and a set of outputs 30. In the example in FIG. 1, each functional unit 20-28 has 12 inputs and 9 outputs. However, the number of inputs and outputs from the functional units may vary from device to device or within a device from functional unit to functional unit. Each functional unit performs one or more logic functions which when combined with logic functions from itself and other functional units produces the more complex function of the overall programmable logic device.

The programmable logic device also includes a first set of conductive lines, represented by the vertical lines 31 of multiplicity 9, which are permanently connected to the outputs 30 of functional units 20-28. Similarly, the device includes a second set of conductive lines, represented by the horizontal dashed lines 32 of multiplicity 12, which are permanently connected to the input lines 29 of functional units 20-28. Since each of the conductive lines either of the first set 31 or of the second set 32, is connected to the outputs or inputs of a particular functional unit, the multiplicity of these lines exactly matches the number of inputs or outputs of each functional unit. By the term "multiplicity" we mean that each of the lines and dashed lines represented in FIG. 1 is in actuality a collection of conductive lines whose number is indicated by the multiplicity. Thus the vertical solid line indicated by reference numeral 31 actually represents 9 conductive lines, each of which is connected to an output line 30 from functional unit 20. Likewise the horizontal dashed line indicated by reference numeral 32 is in actuality 12 conductive lines each permanently connected to an input 29 of functional unit 20. The actual multiplicity of each of the lines will depend on the number of inputs and outputs for each functional unit 20-28.

The two sets of conductive lines 31 and 32 cross at various areas of the programmable logic device to form programmable interconnection matrices 33. In the example given in FIG. 1, since one set of lines has a multiplicity of 9 and the other set of lines has a multiplicity of 12 the intersection of these two sets of lines forms matrices with 12×9 or 108 programmable crossings. Each of the crossings may be programmed to conduct or not conduct from one line to another by switches from one of a number of technologies. For example, each crossing into an interconnection matrix may be mask programmed at a Fab facility in accordance with a user's instructions by forming VIAs between two levels of crossing lines. Alternatively the interconnection matrices may be field programmable either by providing conductive fuses which may be broken by a user, or by providing EPROM or EEPROM switch transistors.

The programmable logic device also includes a set of input pins 34a and 34b. By "pins", we mean not only DIP-type pins but also other input and output constructions known in the art, such as the metallized contacts of flat chip carriers. In the example in FIG. 1, 16 input pins are provided. However, the number of input pins may vary from device to device. The sets of input pins 34a and 34b are permanently connected to conductive input lines 36a and 36b disposed to cross the second set of conductive lines 32. The crossings of input lines 36a and 36b with conductive lines 32 form programmable interconnection matrices 38. In FIG. 1, each of the interconnection matrices 38 is a 12 by 8 matrix of line crossings which may be made conductive by mask programming, fuse programming or switch programming with EPROMs or EEPROMs. In this manner each of the input pins 34a and 34b is selectively connected to any of the inputs 29 of functional units 20-28.

The programmable logic device also includes a set of output pins 40a and 40b. In FIG. 1, the number of output pins is 12. However, the number of output pins may vary from device to device. Output lines 42a and 42b are disposed to cross the first set of conductive lines 31 forming interconnection matrices 44 at the crossings. In the present example each interconnection matrix 44 is a 6 by 9 programmable array of switches, fuses or mask laid contacts. In this manner each of the output pins 40a and 40b may be connected to any output line 30 of any functional unit 20-28. Typically, the output lines 42a and 42b are not directly connected to output pins 40a and 40b, but are indirectly connected through output modules 46a and 46b. Input and output pins need not be distinct, as represented by line 47 connected a pair of pins 34a and 40a. Output modules 46a and 46b may be programmable logic arrays which can be used to generate data and control signals such as output enable and clock signals.

With reference to FIG. 2, each functional unit 20-28 in FIG. 1 may be a programmable logic array. As is known in the art a programmable logic array includes a programmable AND array 48 and a programmable OR array 50. These two arrays 48 and 50 combine to provide a two-step combinatorial logic. The PLA has a plurality of input lines 29a, 29b, ..., 29l and a plurality of output lines 30a, 30b, ..., 30i. In the present example, the number of input lines is 12 and the number of output lines is 9, but the actual number may vary from device to device and from functional unit to functional unit. The number of input and output lines is however considerably smaller than that of prior programmable logic devices using a single AND array and a single OR array for performing complex logic functions, since the programmable logic device architecture of the present invention breaks down the complex function into a number of simpler functions carried out by each programmable functional unit.

Each input line 29a-l passes through a pair of gates 52 and 54 which provide complementary signals. Each horizontal dashed line represents an AND gate, called a "product line". Each product line 56 is selectively connected to AND gate inputs 57 through programmable links 58. Links 58 may be mask programmed, fuse programmable or switch programmable. Each of the product lines 56 intersects OR input lines 60 leading to EXOR gates 62. Each intersection of a product line 56 and an OR input line 60 forms a programmable link 63 which again may be mask programmed, fuse programmable or switch programmable.

In the functional unit in FIG. 2 the output from EXOR gates 62 may be either directly connected to output lines 30a-i or connected through a flip-flop 64, the selection being made with a switch 63. Flip-flop 64 is a D-type flip-flop whose clock signal is determined by one of the product lines 56 connected via clock line 66. D-type flip-flops are commonly used in programmable logic devices to provide registered outputs. Other types of flip-flops and latches may also be used as well as feedback lines to either the AND array 48 or to input lines 29a-l. While functional units are preferably of the programmable logic array type, with both programmable AND and programmable OR arrays, they may also be of the other programmable logic device types with either fixed AND or fixed OR arrays.

FIG. 3 shows an interconnection matrix 33. Interconnection matrices 38 and 44 in FIG. 1 are of similar construction. Any of the first set of conductive lines 31, i.e., the conductive lines permanently connected to outputs 30 of functional units, shown in FIG. 3 as solid vertical lines 31a-i can be connected to any of the first set of conductive lines 32 i.e. those lines permanently connected to inputs 29 of functional units and shown as dashed horizontal lines 32a-l. Connection is made usually by closing a switch. In some cases, for example with fuses, the switch is closed until it is explicitly opened while with other switches such as EPROMs and EEPROMs the switch is open until it is explicitly closed. One hundred and eight switches 66 are shown in FIG. 3. The number of switches will vary from interconnection matrix to interconnection matrix, depending on the multiplicity of conductive lines 31 and 32.

With reference to FIGS. 4 and 4a, any selection of outputs from functional units can be connected to output pins 40 by means of an output module 46. Output module 46 includes an AND array 68 and an OR array 70 which can be programmed to control the outputs 40 by providing signals like output enable 76 and clock 74 as well as data signals 72 from output lines 42. Discrete logic output macrocells 78 generate the data output in response to clock and output enable signals 74 and 76. Other control signals might also be generated. Further, as seen in FIG. 4a, the data signals 72 need not go through the AND and OR array 68 and 70, but may instead connect directly to macrocells 78.

FIG. 5a shows one column 31a of interconnection matrix 33 in FIG. 3. Each switch 66 along conductive line 31a contributes capacitance to the overall circuit thereby slowing the circuit down. For example, conductive line 31a sees the capacitance of 12 switches 66 for connecting line 31a to the second set of conductive lines 32a-l. In the overall interconnection matrix shown in FIG. 3 there would be 108 switches present and a time delay of approximately 60 nanoseconds through the entire interconnection matrix. FIG. 5b shows a portion of a preferred interconnection matrix. Conductive line 31a is not directly connected to the second set of conductive lines 32a-l via switches 66, but is instead connected through extra series switches 81a' and 81a''. In practice most conductive lines 31 from outputs will be connected to one or two conductive lines 32 to inputs. Only occasionally will there be more. In FIG. 5b series switch 81a' connects a main conductive line 31a to a branching conductive line 31a' while a second series switch 81a'' connects main conductive line 31a to branching conductive line 31a''. The branching lines 31a' and 31a'' are then connected to second set of conductive lines 32a-l via switches 66. If no connection is made only the capacitance of the series switches 81a' and 8a" is seen. If one connection is made only the capacitance of one of the series switches 81a' or 81a" is seen together with only half of the remaining switches 66. Accordingly, if an output from a functional unit has a fanout of two, then it will see the inductance of only 30 switches instead of 108 switches. This approach can also be cascaded by defining the inputs into supergroups with a series switch to a supergroup and series switches to each group within the supergroup. The approach is not limited to outputs. The inputs could also be buffered from the inductance in the same way. That is, each conductive line of the second set may also comprise a main line and branching lines, with the branching lines being connected to the main line through series switches and connected to conductive lines of the first set, including possible branching lines of the first set, via additional switches or other programmable links.

OR arrays are useful because they allow two-stage logic to be used. PALs, with fixed ORs, also do this but at the expense of not being able to use product terms for multiple ORs. Product terms of PALs are committed to specific ORs and a product term not used in one AND-/OR function cannot be used in another which may need extra ORs. A fixed OR is however faster and thus PALs trade off function for speed. Programmable OR terms in PLAs are slow for the same reason as the interconnection matrices, i.e. the capacitance of the switches. A programmable AND/OR array with an OR array 50' optimized for speed in shown in FIG. 6. Here the product terms 56 from AND array 48 can be connected via a switch 84 to two different lines 86 and 88 running through OR array 50'. Line 88 is a conventional product term which may be programmably connected via switches 90 to any of the input lines 92 to the OR gates of OR array 50. The second line, line 86, could be connected by a switch or switches 94 to some subset of OR terms. This arrangement allows the programmer to chose between the speed path 86 with some loss of product sharing or have a slower path 88 with full flexibility. This choice can be made for each product term 56.

In FIG. 6a, another OR array 50" is seen. Instead of using switches 84 as in FIG. 6 to choose the level of programmability, the product lines 56 connect to subsets only of OR gate input lines 60. In other words, the input lines 60 are only partially populated with programmable links 63 to product lines 56. For example, a typical arrangement for an AND/OR array, line that seen in FIG. 2 modified as in FIG. 6a to have OR input lines 60 only partially populated with links 63, includes 12 AND input lines, 44 product terms, 27 OR gate input lines (including input lines to latches or flip-flops 64) and 9 output lines. The OR gate input lines are grouped into threes, with two lines leading to an EXOR gate 62 and the third line serving as a clock for latch 64. The programmable links are typically staggered so that the first 12 product terms are connectable to the first group of three groups of three OR input lines, product terms 5–16 are connectable to the second group of OR input lines, product terms 9–20 are connectable to the third group of three groups of three OR input lines, and so forth, with the last 12 product terms 33–44 connectable to the ninth group of three groups of three OR input lines. Other partially populated arrangements of programmable links can also be constructed.

FIG. 7 shows the propagation time through a programmable logic device in accordance with the present invention, using the speed optimized programmable interconnection matrix described above with reference to FIG. 5b and functional units with optimized OR arrays as described above with reference to FIG. 6. From input pins 98 through input buffer 100 takes 4.5 nanoseconds. The propagation time through input switch matrix 102 takes 6 nanoseconds. The propagation time through the AND/OR array 104 of a functional unit takes 15 nanoseconds. The propagation time through flip-flop registers 106 takes 3 nanoseconds. The propagation time through output interconnection matrix 108 takes 6 nanoseconds and the time through output buffer 110 takes 7.5 nanoseconds. The total propagation time from input pins 98 to output pins 114 is 42 nanoseconds. The toggle propagation path 112 for propagation through additional functional units takes 24 nanoseconds per functional unit. This is a toggle rate of 40 MHz.

With reference to FIG. 8, a second embodiment of a programmable logic device in accordance with the present invention provides for a limited number of inputs a way of bypassing the interconnection matrices for a fast direct path to some output pins. In the example in FIG. 8, 10 out of 16 input pins, 8 input pins in a first group 34a and 2 input pins in a second group 34b, may be connected as before via input lines 36a and 36b and interconnection matrices 38 to inputs 29 of functional units 20–28. However 6 of the 16 input pins 34c may either be connected via input buffer 118, input lines 36c and interconnection matrices 39 to inputs 29 of functional units 20–28 or may be connected via multiplexer 117 to inputs 116 of a functional unit 122 performing a simple logic function. The outputs from functional unit 122 may be connected via buffer 120 to a set of conductive lines 121 to either additional functional units or output pins 40a and 40b through interconnection matrices. The outputs from function unit 122 may also be connected through conductive lines 124 to output pins 126 without going through any interconnection matrices. Output pins 126 are connected to conductive lines 124 or to the regular conductive lines 125 via a multiplexer 123.

As seen in FIG. 9, the bypass path 128 through AND-/OR array 122 has a total propagation time of 28 nanoseconds from input pins 98 through buffer 100 through functional unit 122 and then out through buffer 110 and output pins 114. This is considerably faster than the path taken through interconnection matrices 102 and 108 which, as mentioned above, is a duration of 42 nanoseconds. Such a fast path is useful, e.g., for enabling the appropriate memory devices in response to a high address bit from a CPU data request.

With reference to FIG. 10, functional units 22–28 for providing complex control logic need not be the only units present in the matrix of functional units. For example, a random access memory subunit 130 with a set of inputs for address, write, and enable, as well as a set of outputs for data, may be connected to the same sets of conductive lines 31 and 32 as other functional units. Similarly an arithmetic logic unit 132 with inputs A and B for operands and inputs F for operators as well as outputs for operation results may be connected in the same manner. Such an arrangement could integrate central processing units with their glue logic on the same chip.

Structures may be provided in a programmable logic device to facilitate testing of the programming. For example, with reference to FIG. 11, a pair of multiplexers 134 and 136 may be provided to access individual functional units 20-28. Multiplexer 134 is situated along an end of the first set of conductive lines 31 in order to access the outputs from functional units 20-28. A set of input pins 34a and pins A-G is temporarily dedicated to functional unit testing, and a set of output pins 40a is similarly temporarily dedicated. Pass gates 138 and 140 in response to signals along pins F and G enable input pins 34a and output pins 40a to interact with multiplexer 134. Signals along pins A, B, C and D determine which functional unit 20-28 is accessed. Multiplexer 136 is similarly connected to inputs to functional units 20-28 and is similarly controlled. Pass gates 139 and 141 in response to signals along pins J and H enable input pins 34b and output pins 40b to interact with multiplexer 136.

In operation, programming may be tested by first programming the functional units 20-28, leaving all interconnection matrices 33 open. Input lines 32 to functional units 20-28 are then driven by signals coming in from input pins 34b and multiplexer 136. Data, i.e. test results, are read out from output pins 40a via multiplexer 134 accessing output lines 31. Once the user is assured that each of the functional units 20-28 has been properly programmed and performs as expected, the interconnection matrices 33 are programmed. Interconnections are tested by accessing the same lines 31 and 32 via multiplexers 134 and 136. This procedure thus provides complete testability of all parts of the device, and works for all devices of the present invention using EPROM and EEPROM switches. This procedure does not work for devices having fuse links that are programmed by blowing, i.e. opening, connections, but does work for devices using links that are grown to close selected connections.

An advantage to accessing individual functional units 20-28 for testing is that since the functional units 20-28 have considerably fewer inputs they can be exhaustively tested. In the example in FIG. 11 each functional unit has 12 inputs so the total number of input combinations is $2^{12}$ or 4,096 per functional unit. This means only 36,864 combinations need be tested for the entire device to be tested. A large programmable logic array could require up to 64 inputs to achieve the same level of function complexity as the present device. There would be no way to exhaustively test $2^{64}$ possible input combinations in such a device.

Despite simulating the logic under a series of expected conditions, designers often encounter conditions that they have not taken into account. When they test the complete system or subsystem they find that it does not perform as expected. When SSI and MSI circuits are used, designers can "watch" the system perform, using instruments like oscilloscopes and logic state analyzers. However, they do not have access to the internal nodes of an integrated circuit so they cannot monitor what is actually happening in the same way as in the non-integrated case. Hence it is advantageous to add monitoring logic on a PLD, or a special variant of one produced for the testing phase, which will provide the monitoring information. An example of one such structure is shown in FIG. 12.

Referring then to FIG. 12, a programmable AND array 145 communicates with at least some, and typically all, of the output lines 31 from functional units 20-28, as well as lines 36a and 36b from input pins 34a and 34b. A random access memory (RAM) 147 communicates with AND array 145 and with two sets of pins 149 and 150. Address pins 149 are used from programming the AND array 145 and RAM 147 to record logic states when certain conditions are satisfied, while data pins 150 are used for reading out information recorded in RAM 147. In operation, when a programmed subset of output states on lines 31 and 36a-b meets a programmed condition, the AND array 145 detects this condition and transfers another programmed subset of output states to RAM 147, where these states are stored in selected memory addresses. When the programmed condition is not met, no information is recorded. The stored information can be read out from RAM 147 via data pins 150. Alternatively, data can be read out serially. The condition that triggers the recording of information can include an outside signal as shown by input pin 152 to the AND array 145. The trigger can be brought to the external world as shown by output pin 154 from the AND array to allow external conditions to be monitored as well.

With reference to FIG. 13, the programmable logic device architecture of the present invention can be extended to even higher densities by introducing an additional level of program hierarchy. A programmable logic device in FIG. 13 is composed of two halves or "subchips". More than two subchips could also be provided. A first subchip 160 comprises a plurality of functional units 20-28 with inputs 29 permanently connected to a set of conductive lines 32 and with outputs 30 permanently connected to a set of conductive lines 31. Conductive lines 31 and 32 cross at programmable interconnection matrices 33. Sets of input pins 34a and 34b connect to conductive lines 32 via input lines 36a and 36b and interconnection matrices 38, and sets of output pins 40a and 40b connect to conductive lines 31 via output modules 46a and 46b, output lines 42a and 42b and interconnection matrices 44. A second subchip 162 likewise constructed with functional units 20a-28a having inputs and outputs 29 and 30, conductive lines 31 and 32, input pins 34c and 34d, input lines 36c and 36d, output pins 40c and 40d, output modules 46c and 46d, output lines 42c and 42d, and associated interconnection matrices.

A programmable switching matrix 164 connects the two subchips 160 and 162, so that any signal in one subchip can be connected anywhere else, though not all simultaneously. Switching matrix 164 includes a set of central connect lines, represented by horizontal dashed lines 166, each of plural multiplicity, and two sets of lead lines, represented by vertical lines 168 and 169, again of plural multiplicity. Input lines 36a-d and conductive lines 31 from functional unit outputs 30 cross the central connect lines 166 at programmable interconnection matrices 170. Likewise, lead lines 168 and 169 cross central connect lines 166 at interconnection matrices 172, which may be either fixed or programmable. Lead lines 168 and 169 also cross conductive lines 32 leading to functional unit inputs 29 of respective first and second subchips 160 and 162, at programmable interconnection matrices 174.

Accordingly, input pins 34a and 34b may be programmed to connect to functional unit inputs 29 of first subchip 160 directly through input lines 36a and 36b and conductive lines 32 or to functional unit inputs of second subchip 162 through input lines 36a and 36b, central connect lines 166 and lead lines 169 of switch matrix 164, then through conductive lines 32 on the second subchip 162. Likewise, input pins 36c and 36d can be programmed to connect to functional unit inputs of second subchip 162 directly or to functional unit inputs of first subchip 160 indirectly through central connect lines 166 and lead lines 168 of switch matrix 164. Conductive lines 31 from functional unit outputs 30 on one subchip can also be programmed via switch matrix 164 to connect with conductive lines 32 leading to functional unit inputs 29 or to output lines 42a-d leading to output pins 40a-d on the other subchip.

With reference to FIG. 14, there are some frequently used arithmetic and logic functions which cannot easily or quickly be done with a small number of product terms using an AND/OR array. Addition and testing a result for zero are two examples. Consider, for example, the addition of two numbers A and B to obtain a sum S. The nth bit of the sum $S_n$ is $S_n=(A_n\cdot\sim B_n\cdot OR\cdot\sim A_n\cdot B_n)\cdot EXOR\cdot C_{n-1}$, where $C_{n-1}=A_{n-1}\cdot B_{n-1}\cdot OR\cdot A_{n-1}\cdot C_{n-2}\cdot OR\cdot B_{n-1}\cdot C_{n-2}$ is the carry in from a previous computation stage. The carry term can be calculated sequentially, i.e. by a "ripple carry", by feeding the previous carry term back into the array. Unfortunately, this means that multiple passes through the array need to be done, which may not be fast enough in many situations. An alternative is to generate all of the carry terms simultaneously.

$$C_1 = A_1\cdot B_1\cdot OR\cdot A_1\cdot C_0\cdot OR\cdot B_1\cdot C_0,$$
$$C_2 = A_2\cdot B_2\cdot OR\cdot A_2\cdot C_1\cdot OR\cdot B_2\cdot C_1$$
$$= A_2\cdot B_2\cdot OR\cdot A_2\cdot A_1\cdot B_1\cdot OR\cdot$$
$$A_2\cdot A_1\cdot C_0\cdot OR\cdot A_2\cdot B_1\cdot C_0\cdot OR\cdot$$
$$B_2\cdot A_1\cdot B_1\cdot OR\cdot B_2\cdot A_1\cdot C_0\cdot OR\cdot$$
$$B_2\cdot B_1\cdot C_0, \text{ etc.}$$

It is easily seen that the number of terms increases geometrically and that 52 product terms will be needed just to calculate the first four carry terms.

The functional unit in FIG. 14 uses some additional specialized logic at the output of the sum terms to help in this calculation. This functional unit comprises an AND array 178, generating product terms 179, and an OR array 180 having OR gate input lines 183 programmable connected to the product terms 179 and leading into OR gates 184, in the present case exclusive OR gates. The functional unit also contains latches or flip-flops 186 which can be programmed by a switch 187 to either always pass the outputs from the OR gates to the functional unit outputs 188 or to act as a register in response to clock lines 185. The OR array 180 can be partially populated with programmable links 189, as shown, can be fully populated as in FIG. 1, or can have branched product terms as in FIG. 6.

In addition to this AND/OR array, the functional unit also has a specialized unit 182 with dedicated logic. In the unit shown in FIG. 14, the specialized unit 182 aids in performing addition. However in other instances the specialized unit may have dedicated logic for performing some other functions. In the present instance, the specialized unit determines the carry term $C_n=A_n\cdot B_n\cdot OR\cdot A_n\cdot C_{n-1}\cdot OR\cdot B_n\cdot C_{n-1}$, and thereby allows addition to be done with just four product terms, $A_n\cdot\sim B_n$, $\sim A_n\cdot B_n$, $A_{n-1}$ and $B_{n-1}$. Specialized unit 182 is only used where needed and is programmably linked to the remainder of the AND/OR array by an EPROM switch 190.

The programmable logic device architecture of the present invention achieves a large amount of functional flexibility combined with high speed and low cost by providing individually programmable functional units, with a fixed set of wiring forming interconnection matrices which also can be individually programmed. Further, by providing a fast path through the chip many logic functions can be performed without considerable delay. Additional hierarchical levels for the device, as well as dedicated units programmably connectable to Functional unit AND/OR arrays, provide increased functionality. Individual access to functional units and logic state recording facilitates exhaustive testing of the device.

I claim:

1. A programmable logic device comprising,
a matrix of functional units, each functional unit having a set of inputs and a set of outputs, each functional unit being individually programmable for carrying out one or more specified logic functions, each functional unit being a programmable logic device with an AND array and an OR array connected to the AND array,
a first set of conductive lines, each line of said first set being permanently connected to an output from an OR array of one of said functional units,
a second set of conductive lines, each line of said second set being permanently connected to an input to an AND array of one of said functional units,
wherein said second set of conductive lines cross said first set of conductive lines, areas where said first and second sets of conductive lines cross forming programmable interconnection matrices, said matrices including programmable links at the intersections of each conductive line of the first set with a conductive line of the second set, each of said links being selectively openable and closeable so as to connect any output of any functional unit to any input of any functional unit,
a plurality of input pins, each input pin being selectively connectable to at least one conductive line of said second set, and
a plurality of output pins, each output pin being selectively connected to at least one conductive line of said first set.

2. The device of claim 1 wherein said functional units comprise programmable logic arrays, both said AND arrays and said OR arrays of said functional units being programmable.

3. The device of claim 1 wherein said programmable logic devices further include registers programmably connected between said OR array and said set of outputs.

4. The device of claim 1 wherein said functional units and said interconnection matrices are mask programmable.

5. The device of claim 1 wherein said functional units and said interconnection matrices are fuse programmable.

6. The device of claim 1 wherein said functional units and said interconnection matrices are EPROM switch programmable.

7. The device of claim 1 wherein said functional units and said interconnection matrices are EEPROM switch programmable.

8. The device of claim 1 wherein said output pins are indirectly connected to selected conductive lines of said first set via at least one output module, each output module comprising a programmable logic array with inputs connected to said selected conductive lines and with outputs connected to said output pins, said programmable logic array generating control signals.

9. The device of claim 8 wherein said programmable logic array forming said output module generates both data and control signals.

10. The device of claim 1 wherein each of said conductive lines in said first set comprises,
a main line permanently connected to an output of one of said functional units, and
a plurality of branching lines connected to said main line by series switches, said branching lines crossing said second set of conductive lines within said programmable interconnection matrices, said branching lines being selectively connectable to said second set of conductive lines through programmable links.

11. The device of claim 1 wherein each of said conductive lines in said second set comprises,
a main line permanently connected to an input of one of said functional units, and
a plurality of branching lines connected to said main line by series switches, said branching lines crossing said first set of conductive lines within said programmable interconnection matrices, said branching lines being selectively connectable to said first set of conductive lines through programmable links.

12. The device of claim 2 wherein each said product lines leading from said AND array branch into a first product line and a second product line, one of said first and second product lines being connected to said product line leading from said AND array by a programmable link, said first product line being connectable to any of a plurality of OR gate input lines of said programmable OR array, said second product line being connectable to only a subset of said OR gate input lines.

13. The device of claim 2 wherein said product lines connect to subsets of OR gate input lines of said programmable OR array.

14. The device of claim 2 further comprising a specialized unit with dedicated logic programmably connected to said programmable OR array.

15. The device of claim 1 wherein a subset of said plurality of input pins are directly connectable to inputs of a functional unit that is programmable for carrying out a simple logic function, outputs of said functional unit being directly connectable to a subset of said plurality of output pins.

16. The device of claim 1 wherein one of said functional units is a random access memory.

17. The device of claim 1 wherein one of said functional units is an arithmetic logic unit.

18. The device of claim 1 further comprising a first multiplexer and a second multiplexer, said first multiplexer being permanently connected to said first set of conductive lines, said second multiplexer being permanently connected to said second set of conductive lines, each of said multiplexers being connectable via gates to at least a subset of said input and output gates, said multiplexers being connected to said conductive lines so as to provide access to said inputs and outputs of a selected functional unit.

19. The device of claim 1 further comprising means communicating with said conductive lines for monitoring logic states on a first subset of said conductive lines and for transmitting to an output selected logic state information on a second subset of said conductive lines in response to a programmed test condition of said monitored states.

20. The device of claim 1 wherein said monitoring and transmitting means comprises a programmable AND array connected to said first set of conductive lines, a random access memory connected to said programmable AND array and a set of pins connected to said random access memory for inputting programming information into and for reading logic state information out of said random access memory, said programmable AND array and said random access memory responsive to programmed condition on a first subset of said conductive lines for storing logic state information on a second subset of said conductive lines.

21. A programmable logic device comprising,
a plurality of programmable logic arrays, each programmable logic array having a set of inputs and a set of outputs,
a first set of conductive lines, each conductive line including a main line permanently connected to an output of one of said programmable logic arrays and a plurality of branching lines connected to said main line by series switches,
a second set of conductive lines, each conductive line of said second set including a main line permanently connected to an input of one of said programmable logic arrays and a plurality of branching lines connected to said main line by series switches,
wherein said branching lines of said first and second sets of conductive lines cross at areas forming programmable interconnection matrices, said matrices including programmable links at the intersections of each branching line of the first set with a branching line of the second set, each of said links being switchable so as to selectively connect any output of a programmable logic array to an input of a programmable logic array,
a plurality of input pins selectively connected to at least one conductive line of said second set, and
a plurality of output pins selectively connectable to at least one conductive line of said first set.

22. The device of claim 21 wherein said programmable logic arrays and said programmable links are mask programmable.

23. The device of claim 21 wherein said programmable logic arrays and said programmable links are fuse programmable.

24. The device of claim 21 wherein said programmable logic arrays and said programmable links are EPROM switch programmable.

25. The device of claim 21 wherein said programmable logic array and said programmable links are EEPROM switch programmable.

26. The device of claim 21 wherein a subset of said plurality of input pins is directly connectable to inputs of a programmable logic array, outputs of said programmable logic array being directly connectable to a subset of said plurality of output pins.

27. The programmable logic device of claim 21 further comprising a first multiplexer and a second multiplexer, said first multiplexer being permanently connected to said first set of conductive lines so as to provide access to said outputs of a selected programmable logic array, said second multiplexer being permanently connected to said second set of conductive lines so as to provide access to said inputs of said selected programmable logic array, each of said multiplexers including multiplexed input pins for selecting access to one of said programmable logic arrays, each of said multiplexers being connectable via gates to at least a subset of said pluralities of input and output pins.

28. The programmable logic device of claim 21 further comprising means communicating with said conductive lines for monitoring logic states on a first subset of said conductive lines and for transmitting to an output selected logic state information on a second subset of said conductive lines in response to a programmed test condition of said monitored states.

29. The programmable logic device of claim 21 wherein said monitoring and transmitting means comprises a programmable AND array connected to said first set of conductive lines, a random access memory connected to said programmable AND array and a set of pins connected to said random access memory for putting program information into and reading logic state information out of said random access memory, said programmable AND array and said random access memory responsive to a programmed condition on a first subset of said conductive lines so as to store logic state information on a second subset of said conductive lines.

30. The device of claim 21 wherein each of said programmable logic arrays comprise a programmable AND array and a programmable OR array, said AND array connected to said set of inputs, a plurality of main product lines leading from said AND array, said OR array including a plurality of OR gates and a plurality of OR gate input lines connected to said OR gates, each of said main product lines being connectable to a first product line and a second product line via a programmable switch, said first product line being connectable to any of said OR gate input lines, said second product line being connectable to only a subset of said plurality of OR gate input lines, outputs of said OR gates being connected to said set of outputs of said programmable logic array.

31. The device of claim 21 wherein each of said programmable logic arrays comprises a programmable AND array and a programmable OR array, said AND array connected to said set of inputs, a plurality of product lines leading from said AND array, said OR array including a plurality of OR gates and a plurality of OR gate input lines connected to said OR gates, each of said product lines being connectable to a subset of said OR gate input lines via programmable switches, outputs of said OR gates being connected to said set of outputs of said programmable logic array.

32. The device of claim 21 wherein at least one of said programmable logic arrays includes a specialized unit with dedicated logic programmably connected to an AND/OR array, said AND/OR array being connected to said sets of input and output lines of said programmable logic array.

33. A programmable logic device comprising,
first and second subunits, each of said subunits having a matrix of functional units, each functional unit having a set of inputs and a set of outputs and being individually programmable for carrying out a specified logic function, each subunit also having a first set of conductive lines, each line being permanently connected to an output of one of said functional units, a second set of conductive lines, each line of said second set being permanently connected to an input of one of said functional units, said first and second set of conductive lines crossing at programmable interconnection matrices, said matrices including programmable links at the intersections of said conductive lines, a plurality of input pins connected to at least one input line, said input line being programmably connectable to said second set of conductive lines at programmable interconnection matrices, and a plurality of output pins connected to at least one output line, said output line being programmably connectable to said first set of conductive lines at programmable interconnection matrices, and
a switching matrix disposed between said first and second subunits, said switching matrix having central connect lines programmably connected to said at least one input line and said first set of conductive lines of each said subunit, said switching matrix also having two sets of lead lines connectable to said central connect lines, each set of lead lines being programmably connectable to said at least one output line and said second set of conductive lines of one said subunit.

* * * * *